US006643173B2

(12) United States Patent
Takemura

(10) Patent No.: US 6,643,173 B2
(45) Date of Patent: Nov. 4, 2003

(54) SEMICONDUCTOR MEMORY DEVICE OPERATING IN LOW POWER SUPPLY VOLTAGE AND LOW POWER CONSUMPTION

(75) Inventor: Takashi Takemura, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/106,218

(22) Filed: Mar. 27, 2002

(65) Prior Publication Data
US 2003/0090928 A1 May 15, 2003

(30) Foreign Application Priority Data
Nov. 9, 2001 (JP) ........................................ 2001-345339

(51) Int. Cl.[7] ................................................ G11C 16/04
(52) U.S. Cl. ............. 365/185.05; 365/188; 365/185.16; 365/226; 365/154
(58) Field of Search ........................ 365/189.05, 185.16, 365/188, 226, 154

(56) References Cited
U.S. PATENT DOCUMENTS
5,870,331 A * 2/1999 Hwang et al. ............... 365/154
5,986,923 A * 11/1999 Zhang et al. ................ 365/154

OTHER PUBLICATIONS

Nobutaro Shibata et al., "A 1–V Battery Operated 0.25–um SRAM Macrocell for Portable Equipment," The Institute of Electronics, Information and Communication engineers, Technical Report of IEICE, ED97–52, SD997–30, ICD97–42(Jun. 1997).
Nabutaro Shibata et al., "A 1–V Battery Operated .025–um SRAM Macrocell for Portable Equipment," The Institute of Electronics, Information and Communication Engineers, Technical Report of IEICE, pp. 1–8.

* cited by examiner

Primary Examiner—Richard Elms
Assistant Examiner—Tuan T. Nguyen
(74) Attorney, Agent, or Firm—Volentine Francos, PLLC

(57) ABSTRACT

A semiconductor memory device capable of saving power supply voltage and power consumption without increasing the forming area of memory cell array by using MTCMOS technology. In writing data in a memory cell 50-21, a signal RE is turned "H" level, an NMOS 61-1 is turned off and a virtual ground line VGND1 is turned into floating state. When the signal RE is "H" level, the output level of an AND circuit 64-2 turns "L" level and NMOS 55a and 55b turn off. NMOS 53 and 54 turn on by "H" level of a word line WL2 and data in a bit line pair BL1 and BL/ is held on nodes N11 and N12. In reading out data, the signal RE is turned "L" level. When the NMOS 61-1 turns on and the VGND 1 becomes connected to GND, an acceleration circuit 55 accelerates the speed of readout operation.

18 Claims, 12 Drawing Sheets

SEMICONDUCTOR MEMORY DEVICE OPERATING IN LOW POWER SUPPLY VOLTAGE AND LOW POWER CONSUMPTION

BACKGROUND OF THE INVENTION

1. Field of the Invention

The present invention relates to a semiconductor memory device suitable for storing in relatively small storage capacity and utilized for a battery-operated portable terminal and the like. More specifically, the present invention relates to a semiconductor memory device utilized for Static Random Access Memory (hereafter, referred to as SRAM) and the like realizing the operation in low power supply voltage and low power consumption.

2. Description of the Related Art

Conventionally, the technology in this field is, for example, described in the following documents:
Shingaku Gihou;
ICD97-52 (1997-6);
Institution of Electronics, Information and Communication Engineers;
Shibata and Morimura: a 1 V-operated 0.25 μm SRAM macro cell for portable device (pages 1–8)

Recently, the SRAM is widely utilized as a cache memory in such as a large-scale integration (hereafter, referred to as LSI) for a specific use utilized for a mobile terminal and the like. The SRAM utilized as described above needs to be small in size and low in power consumption since the battery limited in voltage (for example, 1.2 V) is used as the power supply. As the power consumption becomes in proportion to the square of the power supply voltage, it is the most effective to lower the power supply voltage for saving the power consumption. However, when the power supply voltage is lowered, the operation speed of an MOS transistor used as one of a field-effect transistor (hereafter, referred to as FET), for example, configuring the SRAM becomes slow. If the threshold voltage of the MOS transistor is lowered in order to making the speed high, the amount of leak current caused by a sub-threshold voltage in standby is increased and the amount of the power consumption also increases at the same time.

To solve this problem, there is presented Multi-Threshold Complementary MOS transistor (hereafter, referred to as MTCMOS) as CMOS-LSI technology capable of being operated in low power consumption (for example, around 1 V) in an active state and low in power consumption caused by the leak current in standby. An example of SRAM configuration in the MTCMOS technology is to be shown as FIG. 11.

FIG. 11 is a schematic diagram showing an example of SRAM configuration in the conventional MTCMOS technology described in the documents presented above. In this SRAM configuration, a memory cell array 10 is configured by an MOS transistor with high threshold voltage and a peripheral circuit by an MOS transistor with low threshold voltage.

The memory cell array 10 has a plurality of word lines WL and a plurality of bit line pairs comprising a positive bit line BL and a negative bit line pair BL/, to the cross points of which a memory cell 11 for storing data is connected.

The peripheral circuit 20 has a row address decoder 21 connected to a plurality of word lines WL and an input/output circuit 22 connected to a plurality of bit line pairs of BL and BL/. The row address decoder 21 is a circuit decoding an address AD with a plurality of bits transmitted from the outside and a circuit selecting the word lines WL. The input/output circuit 22 has a column address decoder outputting a column select signal Y, that is, a bit line selection signal by decoding an address AD with a plurality of bits transmitted from the outside, turns a readout mode by read enable signal RE as a readout control signal, turns a write mode by write enable signal WE as a write control signal, and reads out or writes data DA with a plurality of bits in the memory cell 11 connected to the bit line pair of BL and BL/ selected by the column select signal Y.

Also in this SRAM configuration, in writing the data DA in a certain memory cell 11, for example, a word line WL connected to the memory cell 11 is selected by the row address decoder 21 while the bit line pair of BL and BL/ is selected at the input/output circuit 22, and the data DA transmitted from the outside is written in the memory cell 11.

In reading out the data in a certain memory cell 11, for example, a word line WL connected to the memory cell 11 is selected by the row address decoder 21 while the bit line pair of BL and BL/ is selected at the input/output circuit 22, and the data DA is read out from the memory cell 11 and output from the input/output circuit 22.

The peripheral circuit 20 is connected to the node of power supply voltage VDD (the voltage is, for example, around 1V) through a switch 23 of the MOS transistor with high threshold voltage. The switch 23 is controlled in turned-off state in standby by using a sleep signal φS to control the drain of battery (for example, 1.2 V) caused by sub-threshold leak current. It is difficult to adopt the MOS transistor with low threshold voltage to a plurality of memory cells 11 since the power supply cannot be cut off even in standby for maintaining the contents of memory. Further, it becomes necessary to consider the power consumption of a memory cell part in being operated by sub-threshold leak current if the scale of the memory cell array 10 becomes large.

This power consumption problem can be solved by configuring the memory cell part by CMOS and setting the threshold voltage at the MOS transistor high. However, since the power supply voltage VDD becomes lowered and bit line delay increases extremely in reading out, high operation speed cannot be obtained at an operation guarantee voltage (1 V, for example). In view of the operation speed, it is necessary to reduce the threshold voltage of the MOS transistor also in the memory cell.

In order to deal with this problem, the increase of power consumption caused by the sub-threshold leak current can be controlled while keeping the operation speed high by, for example, configuring the memory cell part by two kinds of MOS transistors different from each other in the threshold voltage and by using each MOS transistor properly in each circuit. An example of memory cell part configuration is to be shown as FIG. 12.

FIG. 12 is a circuit diagram showing an example of the configuration near the memory cell in the conventional MTCMOS technology described in the documents presented above. A memory cell 30 corresponds to the memory cell in FIG. 11 and has a flip-flop comprising two inverters 31 and 32 with high threshold voltage holding data in first and second nodes N1 and N2. An N-channel type MOS transistor (hereafter, referred to as NMOS) 33 for writing with high threshold voltage driven by a potential on the word line WL is connected between the positive bit line BL and the node Ni. An NMOS 34 for writing with high threshold voltage driven by a potential on the word line WL is connected between the negative bit line BL/ and the node N2.

A readout-acceleration circuit 35 is connected between the bit lines BL and BL/. The readout-acceleration circuit 35 accelerates the speed of readout operation by promoting the discharge of bit line capacitance and is configured by NMOS 35a and 35b for reading out with low threshold voltage connected to the bit lines BL and BL/ and by NMOS 35c and 35d with low threshold voltage driven by a potential at the nodes N1 and N2.

In order not to make the operation speed high but to make the power of the memory cell array 10 low, a virtual ground line VGND is arranged almost in parallel to the bit line BL. The one end of the virtual ground line VGND is connected to the node of ground potential GND through an NMOS 41 with high threshold voltage. The NMOS 41 is driven by two-input NOR circuit 42 with low threshold voltage. Since it is a waste of power to accelerate the writing cycle and the operation speed of non-selected bit line by using the acceleration circuit 35, the NMOS 41 is turned off and controlled in a floating state when the acceleration operation is not needed by using the NOR circuit 42 to input the read enable signal RE and the column select signal Y. As a result, the wasteful increase of power is controlled.

Next, the operation of memory cell 30 in FIG. 12 is to be explained. In writing, for example, when the word line WL turns "H" level and the NMOS 33 and 34 turn on, the data in the bit line pair of BL and BL/ is held in the nodes N1 and N2. Also in writing, the read enable signal RE turns "H" level, the output level of the NOR circuit 42 turns "L" and the NMOS 41 turns off. Consequently, the writing operation is not damaged.

In reading, the read enable signal RE and the column select signal Y turn "L" level, the voltage level of NOR circuit 42 turns "H", and the NMOS 41 turns on. Then the virtual ground line VGND turns from floating state into ground potential GND. And then the word line turns "H" level and the NMOS 33, 34, 35a and 35b turn on. At this time, since either node N1 or N2 turns "H" level, either NMOS 35c or 35d turns on.

In reading "H" level at the node N1 and "L" level at the node N2, the NMOS 35d turns on and the NMOS 35c turns off. Hereby readout operation can be accelerated since the bit line is driven by an inverter 31 or 32 and the bit lines BL and BL/ are driven by the NMOS 35a~35d with high capability of driving current and with low threshold voltage. In other words, since the NMOS 35d turns on in reading "H" level at the node N1 and "L" level at the node N2, the potential on the bit line BL/ is pulled down to the ground potential GND through the NMOS 35b, 35d and 41, to accelerate the readout operation.

Also, since the NMOS 41 with high threshold voltage becomes turned off by the output from the NOR circuit 42 in standby and the leak current caused by the sub-threshold current in the NMOS 35a~35d with low threshold voltage, the power consumption can be saved.

By using the conventional memory cell 30 as shown in FIG. 12, however, the following problem still remains.

The readout operation is accelerated since, in reading, the NMOS 41 turns on, the virtual ground line VGND becomes connected to the node of ground potential GND, and the electric charge from the acceleration circuit 35 is discharged to the ground potential GND through the NMOS 41.

In writing operation performed after this readout operation, the NMOS 41 turns off and the virtual ground line VGND, the potential of which is near the ground potential GND, turns into floating state. For example, in writing inversion data with the node N1 "H" level and the node N2 "L" level (in other words, in writing "L" level on the node N1 and "H" level on the node N2), when the word line WL turns "H" level the NMOS 35a and 35b with low threshold voltage turn on before the NMOS 33 and 34 with high threshold voltage turn on. Then the NMOS 33 and 34 turn on after a while.

If the NMOS 35a and 35b turn on ahead, the NMOS 35d turns on since the node N1 turns "H" level with the NMOS 33 turned off. Consequently, the potential on the bit line BL/ is pulled down to the virtual ground line VGND in floating state near the ground potential GND through the NMOS 35b and 35d. As a result, the NMOS 33 and 34 turn on, it becomes hard to write the "H" level of the bit line BL/ on the node N2, and the speed of writing the inversion data is to be lowered.

SUMMARY OF THE INVENTION

In the first aspect of the present invention to achieve the above object, there is provided a semiconductor memory device comprising: a word line; a bit line pair having first and second bit lines and selected by a bit line selection signal; a power supply line; and a memory cell. The memory cell comprises: a data holding circuit holding data in first and second nodes; a first transistor with high threshold voltage connected between the first bit line and the first node and driven by a potential on the word line; a second transistor with high threshold voltage connected between the second bit line and the second node and driven by a potential on the word line; a third transistor with low threshold voltage connected between the first bit line and a third node; a fourth transistor with low threshold voltage connected between the second bit line and a fourth node; a fifth transistor with low threshold voltage connected between the third node and the power supply line and driven by data in the second node; and a sixth transistor with low threshold voltage connected between the fourth node and the power supply line and driven by data in the first node.

Further in the first aspect of the present invention, the memory cell comprises: a seventh transistor with high threshold voltage connected between the power supply line and a fifth node with a specific potential and becoming turned-on in writing and turned-off in reading out; and a logical circuit. The logical circuit makes the third and fourth transistors turned-off in writing and the third and fourth transistors turned-on in reading out, based on the potential on the word line and readout control signal or based on the potential on the word line, the readout control signal and the bit line selection signal.

By adopting this configuration, the seventh transistor turns off and the power supply line turns into floating state, while the third and the fourth transistors turn off by the logical circuit in writing. Hereby the operation speed is not lowered in writing the inversion data. Also, the seventh transistor turns on and the third and fourth transistors turn on by the logical circuit in reading, while the readout operation is accelerated by the third~sixth transistors.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1:
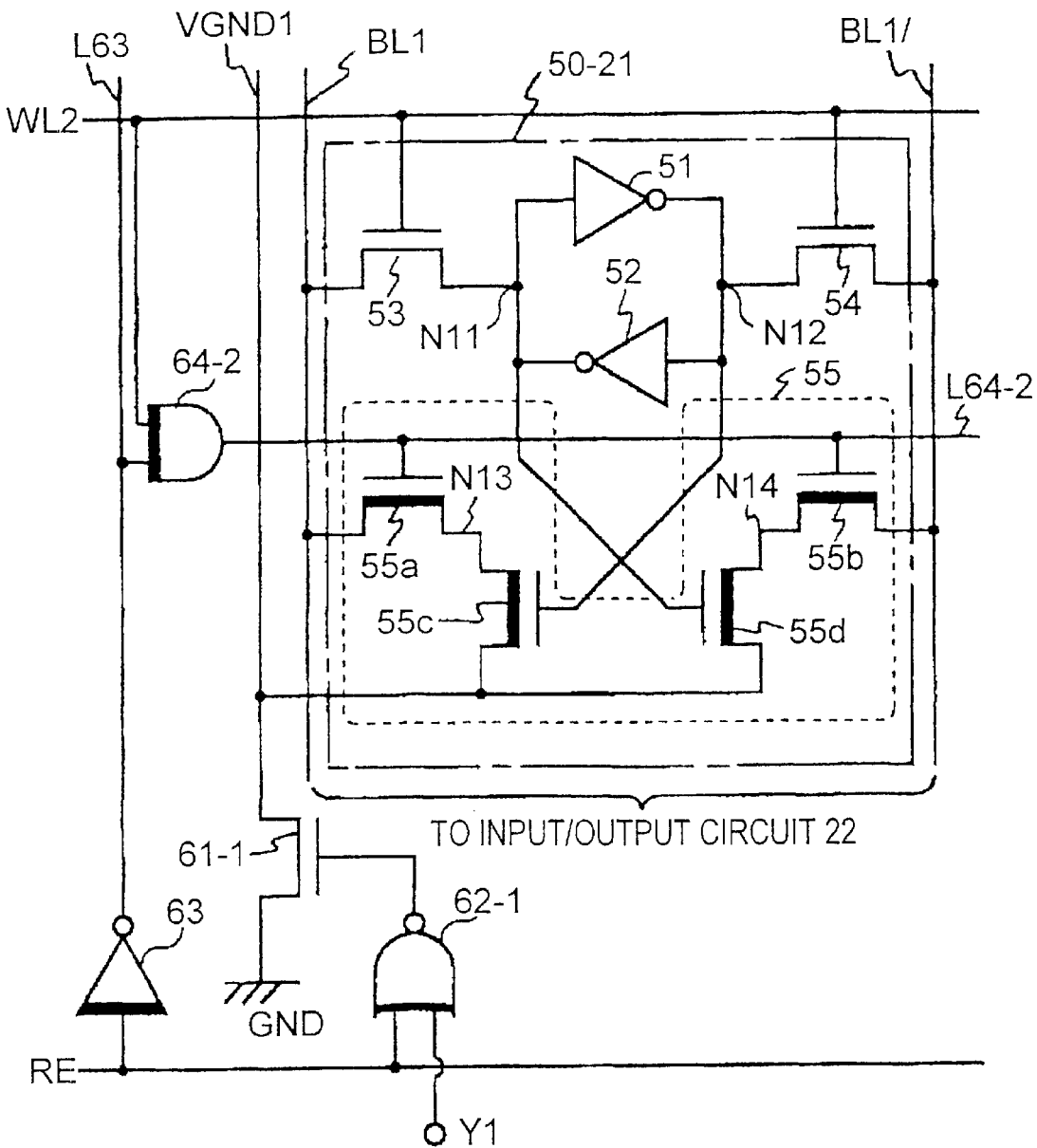
FIG. 1 is a circuit diagram illustrating near a memory cell 50-21 in the first embodiment of the present invention.

Hereinafter, the preferred embodiment of the present invention will be described in reference to the accompanying drawings. Same reference numerals are attached to components having same functions in following description and the accompanying drawings, and a description thereof is omitted.

(First Embodiment)

(1) Configuration

Figure 2:
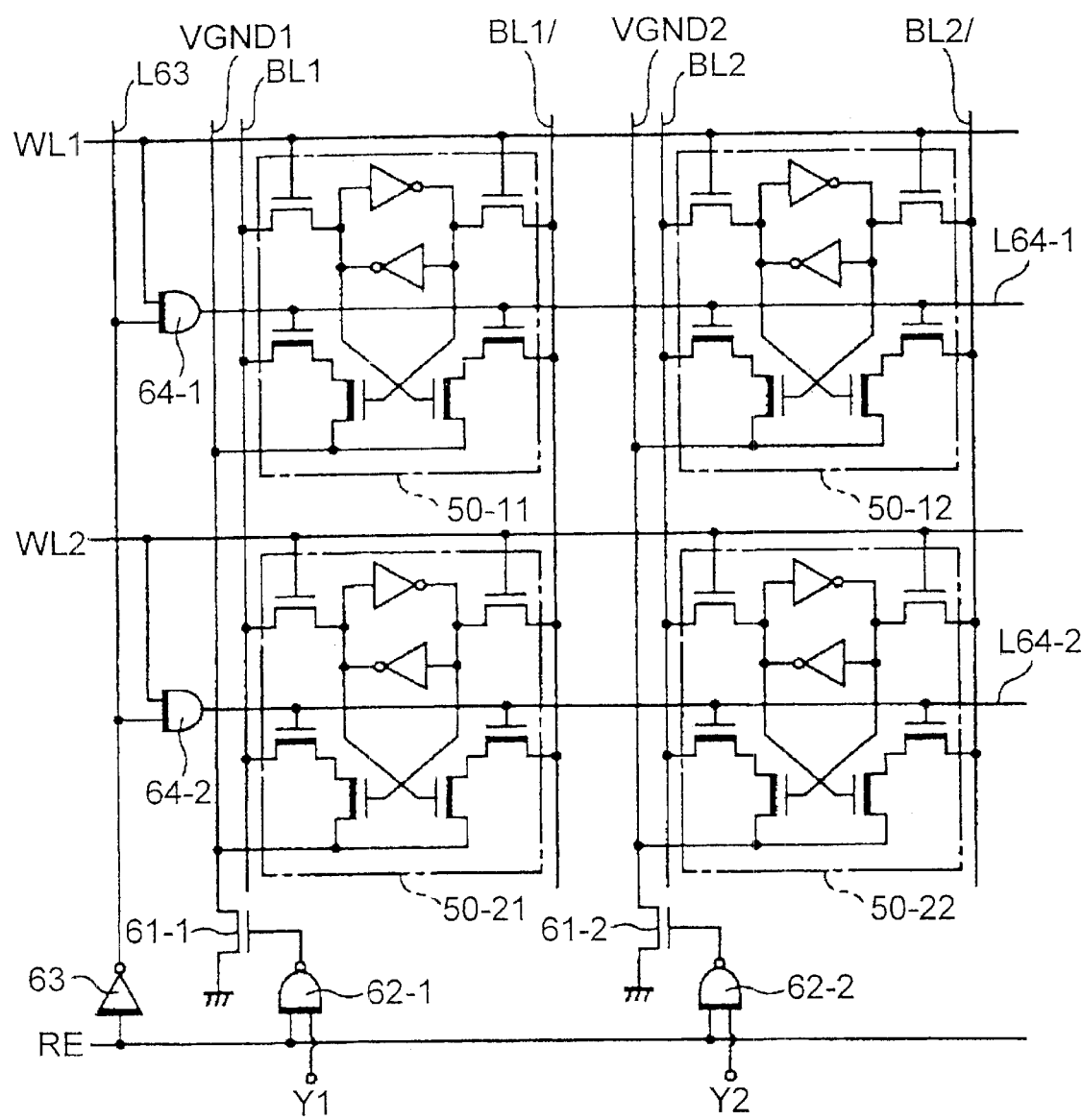
FIG. 2 is a partial circuit diagram illustrating purview of a memory cell array in the first embodiment.

FIG. 2 is a partial circuit diagram illustrating purview of a memory cell array in the semiconductor memory device (for example, SRAM) in the first embodiment of the present invention.

Figure 10:
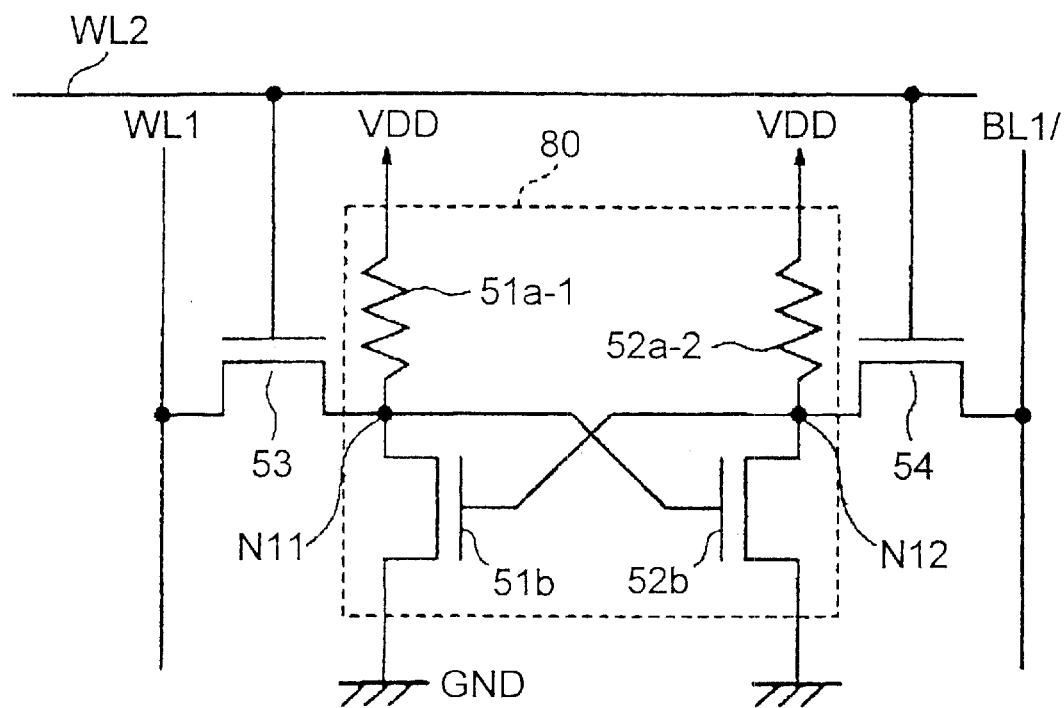
FIG. 10 is a circuit diagram illustrating another configuration example of purview of a memory cell 50-21 in FIGS. 1 and 8.
Figure 11:
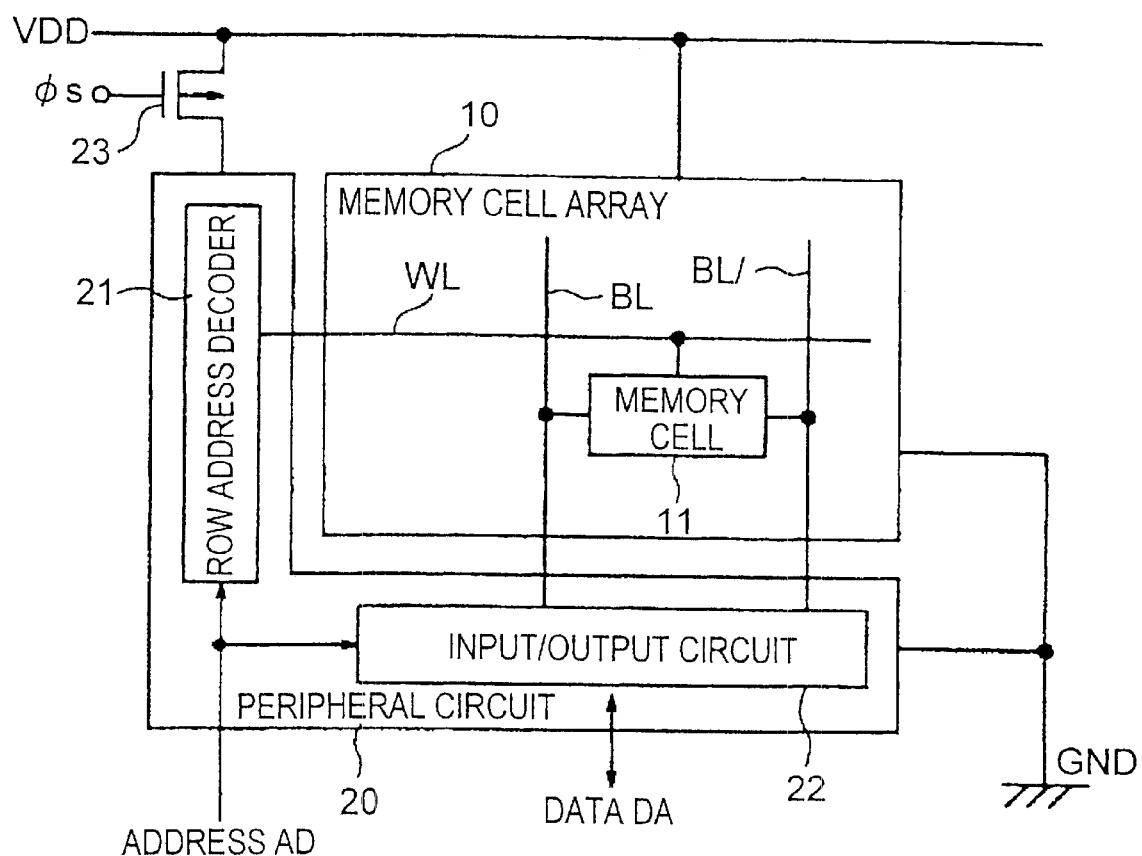
FIG. 11 is a schematic diagram showing an example of SRAM configuration in a conventional MTCMOS technology.
Figure 12:
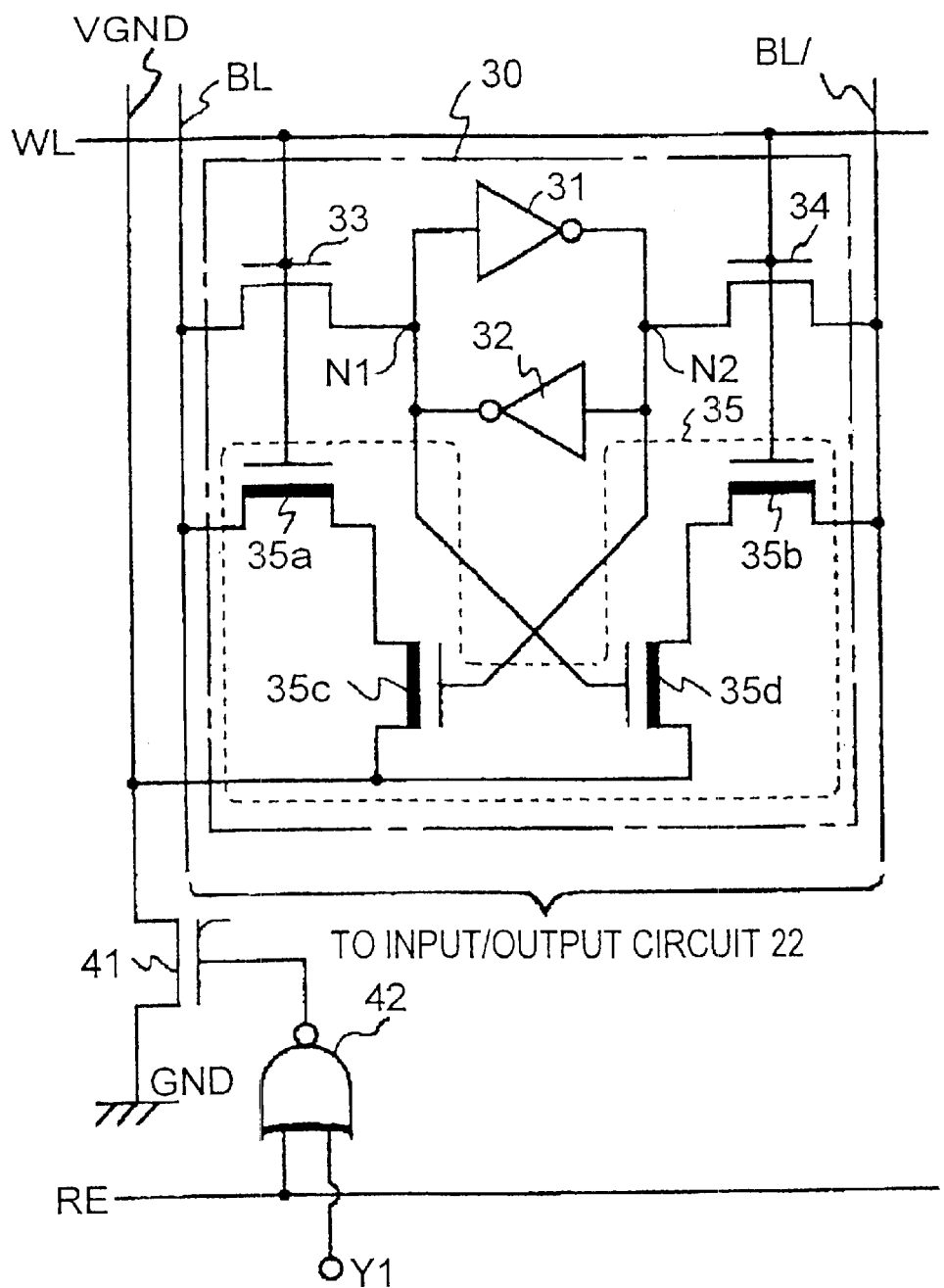
FIG. 12 is a circuit diagram showing an example of configuration near a memory cell in a conventional MTCMOS technology.

The memory cell array is suitable for storing in relatively small capacity (for example, around 128 Kbit) and has a plurality of word lines WL1, WL2, . . . which are connected to a row address decoder 21 shown in FIG. 10 and which are arranged in parallel to each other. A plurality of bit line pairs BL1, BL1/, BL2, BL2/, . . . , each one end of which is connected to, for example, an input/output circuit 22, are arranged almost in parallel to each other and almost in a vertical direction to the plurality of word lines WL1, WL2, . . . . The bit line pairs BL1, BL1/, BL2, BL2/, . . . are configured by the first bit lines (for example, positive bit line) BL1, BL2, . . . and the second bit lines (for example, negative bit line) BL1/, BL2/, . . . . Power supply lines (for example, virtual ground line) VGND1, VGND2, . . . are arranged near and almost in parallel to each bit line BL1, BL2, . . . . Also, output lines L64-1, L64-2, . . . are arranged almost in parallel to and apart from each word line WL1, WL2, . . . in a specific direction. The other end of each bit line BL1, BL1/, BL2, BL2/, . . . is connected to the node of power supply voltage VDD (the voltage is, for example, around 1 V) through a pull-up transistor.

To the cross points of the word lines WL1, WL2, . . . and the output lines L64-1, L64-2, . . . and to the cross points of the bit line pairs BL1, BL1/, BL2, BL2/, . . . and the virtual ground lines VGND1, VGND2, . . . , memory cells 50-11, 50-12, 50-21, 50-22, . . . for storing data are connected, which are arranged in a matrix. Each one end of virtual ground line VGND1, VGND2, . . . is connected to the fifth node in a specific voltage (for example, node of ground potential GND) through the seventh transistors 61-1, 61-2, . . . with high threshold voltage, that is, a switch transistor (for example, NMOS, a kind of FET). The output terminals of the first logical circuit (for example, two-input NOR circuit with low threshold voltage) 62-1, 62-2, . . . are connected to each gate of NMOS 61-1, 62-2, . . . .

Each NOR circuit 62-1, 62-2, . . . outputs "H" level signal and turns on each NMOS 61-1, 61-2, . . . in reading out at which a bit line selection signals, that is, the column select signals Y1, Y2, . . . and a readout control signal, that is, the read enable signal RE that are output from a column address decoder in an output circuit 22 shown in FIG. 10 are input and these signals turn into active state ("L" level). Also, each NOR circuit 62-1, 62-2, . . . outputs "L" level signal and turns off each NMOS 61-1, 61-2, . . . in writing at which the read enable signal RE turns into "H" level. The input terminal of an inverter 63 inverting the readout enable signal RE is provided near the NMOS 61-1. An input line L63 is connected to the output terminal of the inverter 63. The input line L63 is arranged near and almost in parallel to the virtual ground line VGND 1.

The second logical circuits (for example, two-input AND circuit) 64-1, 64-2, . . . are connected to the cross points of the output line L63 and the word lines WL1, WL2, . . . . Each AND circuit 64-1, 64-2, . . . turns output lines L64-1, L64-2, . . . into "H" level in reading out at which the potentials on the word lines WL1, WL2, . . . and the inversion signal of the read enable signal RE are input and the word lines WL1, WL2, . . . and the inversion signal of the read enable signal RE turn into "H" level. Also, each AND circuit 64-1, 64-2, . . . turns output lines L64-1, L64-2, . . . into "L" level in writing at which the word lines WL1, WL2, . . . turn into "H" level and the inversion signal of the read enable signal RE turns into "L" level.

FIG. 1 is a circuit diagram illustrating near a memory cell 50-21 shown in FIG. 2 in the first embodiment of the present invention.

The memory cell 50-21 has a data holding circuit with high threshold voltage, that is, a data holding part for holding data in the first node N11 and the second node N12 (for example, a flip-flop configured by connecting two inverters 51 and 52 back-to-back). The first transistor 53 (for example, NMOS, a kind of FET) with high threshold voltage driven by the potential on the word line WL2 is connected between the node N11 and the bit line BL1. The NMOS 53 is a transistor the gate of which is connected to the word line WL2 and turns on by "H" level of the word line WL2. The second transistor 54 (for example, NMOS, a kind of FET) with high threshold voltage driven by the potential on the word line WL2 is connected between the node N12 and the bit line BL1/. The NMOS 54 is a transistor the gate of which is connected to the word line WL2 and turns on by "H" level of the word line WL2. An acceleration circuit 55 for accelerating the readout speed is connected to the nodes N11 and N12.

The acceleration circuit 55 is configured by: the third transistor 55*a* (for example, NMOS, a kind of FET) with low threshold voltage connected between the bit line BL1 and the third node N13 and driven by the potential on the output line L64-2 of the AND circuit 64-2; the fourth transistor 55*b* (for example, NMOS, a kind of FET) with low threshold voltage connected between the bit line BL1/ and the fourth node N14 and driven by the potential on the output line L64-2; the fifth transistor 55c (for example, NMOS, a kind of FET) with low threshold voltage connected between the node N13 and the virtual ground line VGND1 and driven by the potential on the node N12; and the sixth transistor 55d (for example, NMOS, a kind of FET) with low threshold voltage connected between the node N14 and the virtual ground line VGND1 and driven by the potential on the node N11.

In the memory cell 50-21 with this configuration, the readout operation is performed when the read enable signal RE is "L" level. Other memory cells 50-11, . . . shown in FIG. 2 have the same configuration.

Figure 3:
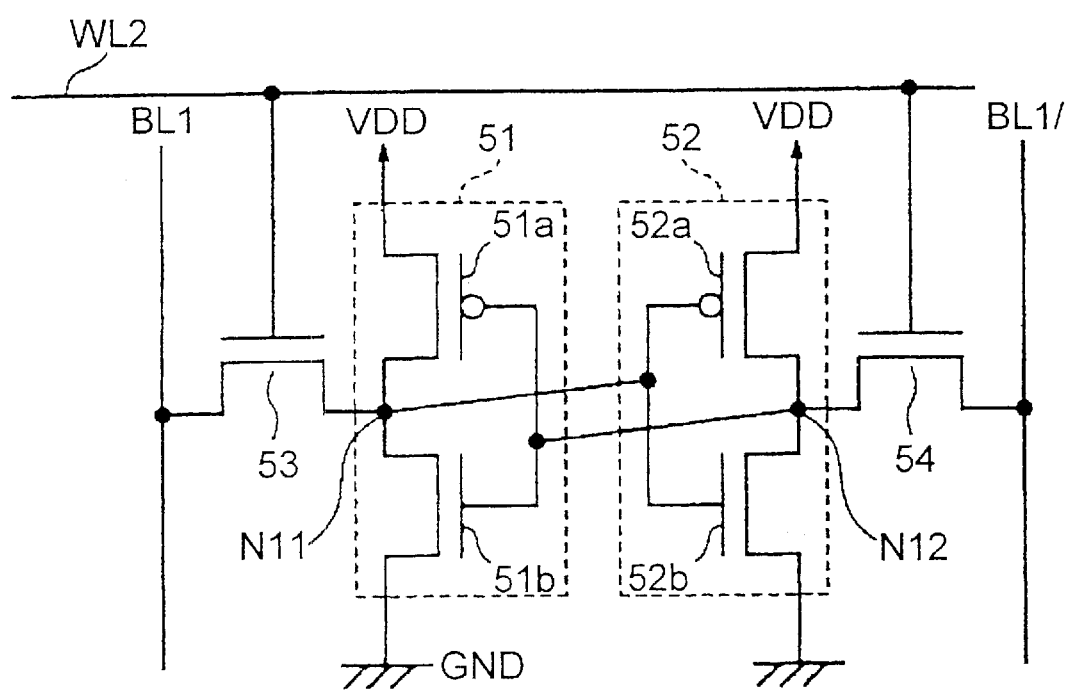
FIG. 3 is a circuit diagram illustrating a configuration example of purview of a memory cell 50-21 in FIG. 1.

FIG. 3 is a circuit diagram illustrating a configuration example of purview of a memory cell 50-21 in FIG. 1.

The memory cell 50-21 is configured by, for example, CMOS. The inverters 51 and 52 configure the flip-flop. The inverter 51 is configured by a P-channel type MOS transistor (hereafter, referred to as PMOS) 51a connected between the node of power supply voltage VDD and the node N11, and an NMOS 52b connected between the node N11 and the node of ground potential GND. The inverter 52 is configured by a PMOS 52a connected between the node of power supply voltage VDD and the node N12, and an NMOS 51b connected between the node N12 and the node of ground potential GND. The gate of the PMOS 51a and the gate of the NMOS 51b are connected to the node N12. The gate of the PMOS 52a and the gate of the NMOS 52b are connected to the node N11, which is connected to the gate of the NMOS 55d shown in FIG. 1, while the node N12 to the gate of the NMOS 55c shown in FIG. 1.

Figure 4:
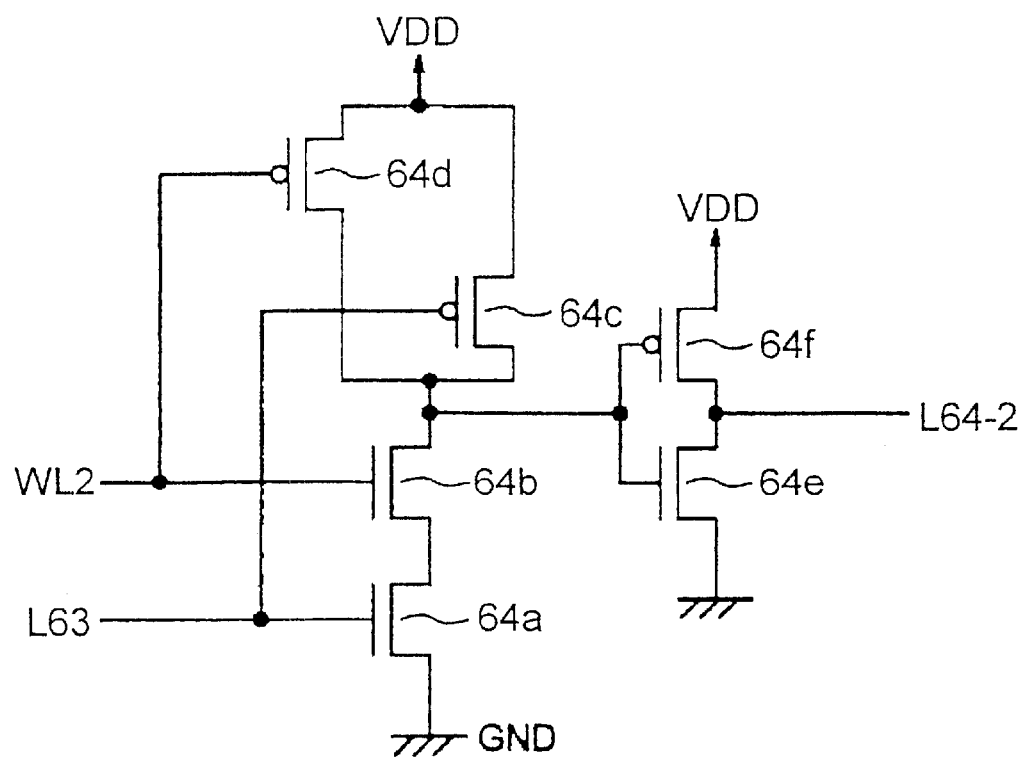
FIG. 4 is a circuit diagram illustrating a configuration example of AND circuit 64-2 in FIG. 1.

FIG. 4 is a circuit diagram illustrating a configuration example of AND circuit 64-2 in FIG. 1.

The AND circuit 62-2 has an NMOS 64a and a PMOS 64c, the gates of which are connected to an output line L63, and an NMOS 64b and a PMOS 64d, the gates of which are connected to a word line WL2. The NMOS 64a and 64b are connected to the node of ground potential GND in series. The PMOS 64c and 64d are connected between the drain of the NMOS 64b and the node of power supply voltage VDD in parallel. To the connection point of the drain of the NMOS 64b and the sources of the PMOS 64c and 64d, the gates of NMOS 64e and PMOS 64f are connected. The NMOS 64e and the PMOS 64f are connected between the node of ground potential GND and the node of power supply voltage VDD in series, and an output line L64-2 is connected to the connection point of the drain of the NMOS 64e and the drain of the PMOS 64f.

(2) Layout Example near Memory Cell

Figure 5:
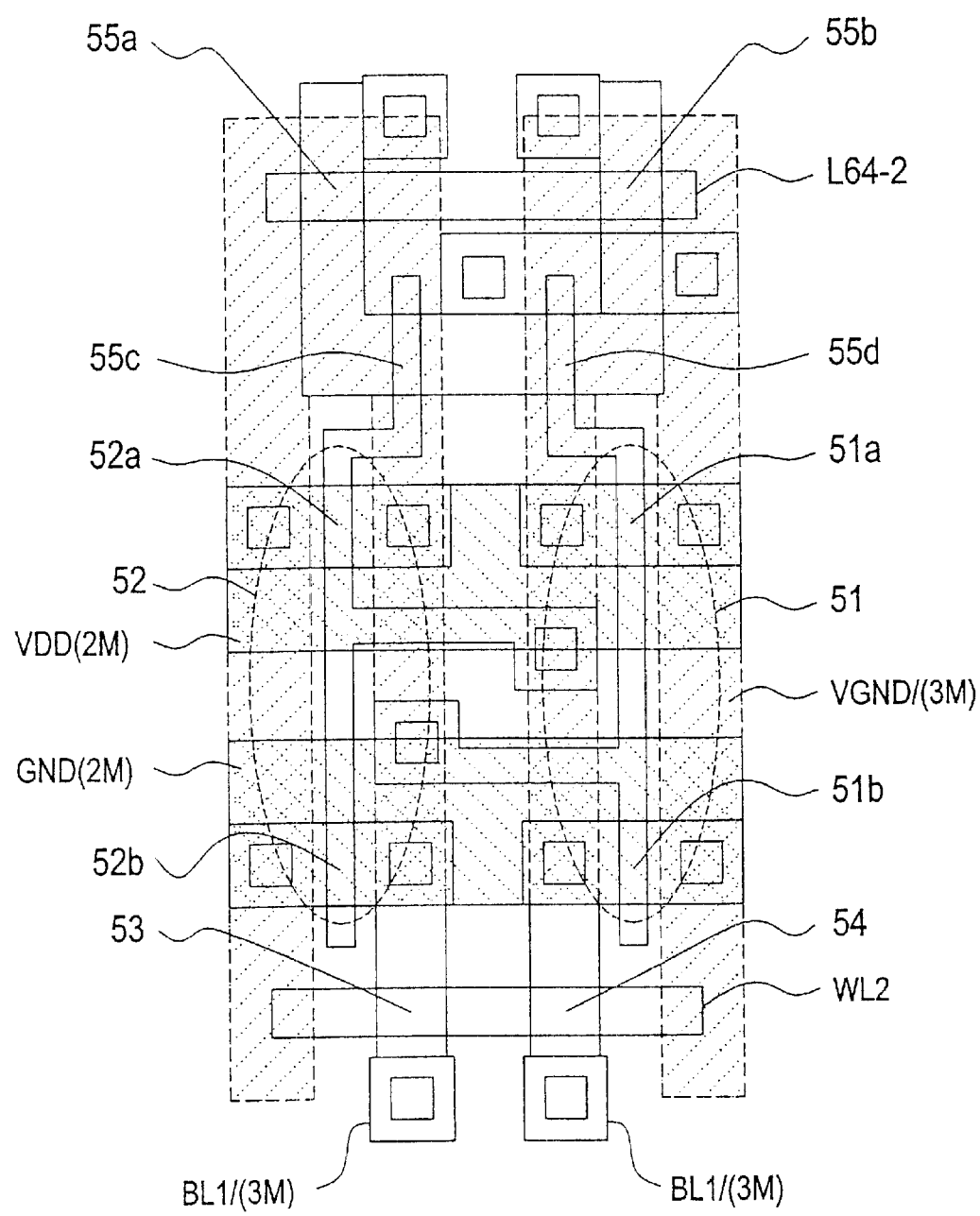
FIG. 5 is a schematic plan view illustrating a layout example of memory cell 50-21 in FIG. 1.

FIG. 5 is a schematic plan view illustrating a layout example of memory cell 50-21 in FIG. 1.

The layout of the memory cell 50-21 is shown in FIG. 5 by using, for example, 0.25 $\mu$m design rule. The inverters 51 and 52 are configured by CMOS as shown in FIG. 3. The bit lines BL1 and BL1/ are formed by third metal wiring (3M) in a vertical direction and almost in parallel. A virtual ground line VGND 1 is formed by third metal wiring (3M) near the bit line BL1/ in a vertical direction and almost in parallel thereto. The word line WL2 is formed downside and in a horizontal direction while the output line L64-2 is formed upside and in a horizontal direction. The node of power supply VDD is formed by second metal wiring (2M) almost in the center and in a horizontal direction. The node of ground potential GND is formed by second metal wiring (2M) downside thereon and in a horizontal direction.

Each MOS transistor is formed by the gate, and the source and drain at both sides thereof. The inverter 51 is formed almost in the center and on the right side thereof while the inverter 52 is formed on the left side thereof. The NMOS 54 is formed under the inverter 51 while the NMOS 53 is formed under the inverter 52. The NMOS 55a and 55c are formed on the upper left of the inverters 51 and 52, and the NMOS 55b and 55d on the upper right thereof.

The memory cell size of SRAM with the acceleration circuit 55 becomes large by the area of MOS transistor configuring the acceleration circuit 55, compared to a memory cell size without an acceleration circuit configured by the inverters 51 and 52 and the NMOS 53 and 54. In this embodiment, the layout as shown in FIG. 5 enables to provide the SRAM with the acceleration circuit 55 with a new virtual ground line VGND 1 and an output line S64-2 without making the memory size large.

Figure 6A:
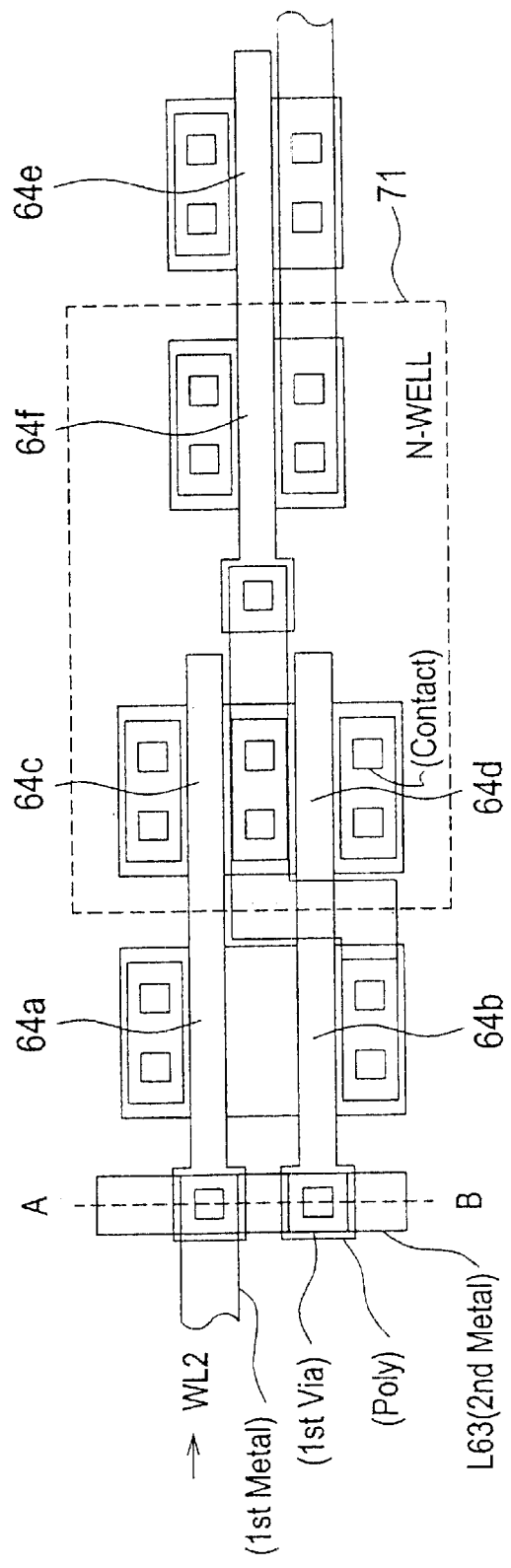
FIG. 6 is a schematic diagram illustrating a layout example of AND circuit 64-2 in FIG. 4.
Figure 6B:
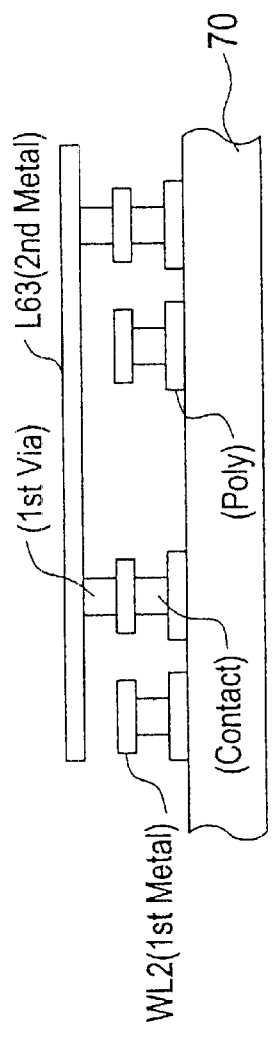

FIGS. 6(a) and (b) are schematic diagrams illustrating a layout example of AND circuit 64-2 in FIG. 4. FIG. 6(a) is a plan view, and FIG. 6(b) is a cross-sectional view along the line A–B of FIG. 6(a).

An N-well 71 is formed inside a semiconductor substrate 70, and PMOS 64c, 64d and 64f are formed inside the N-well 71. NMOS 64a and 64b are formed on the left side of the N-well 71 inside the semiconductor substrate, and further, NMOS 64e is formed on the right side of the N-well 71 inside the semiconductor substrate. The word line WL2 is formed by first metal wiring (1st Metal) and is connected to the gates of the NMOS 64b and the PMOS 64d through the first via part (1st via) and a poly-silicon (Poly). The output line L63 is formed by second metal wiring (2nd Metal) and is connected to the gates of the NMOS 64a and the PMOS 64d. It is to be noted that a contact part (Contact) connects the first metal wiring (1st Metal) and the poly-silicon (Poly).

Forming the AND circuit 64-2 as described above, the memory cell size is extended in a horizontal direction only by the AND circuit 64-2. In the SRAM in this embodiment as shown in FIG. 2, however, one AND circuit 64-2 is provided on a plurality of memory cells 50-21, 50-22, . . . . In this embodiment, in other words, since a plurality of memory cells 50-21, 50-22, . . . share one AND circuit 64-2, the horizontal extension of the memory cell array size can be minimized even if compared to a conventional SRAM without the AND circuit 64-2.

In order to make the horizontal size of the AND circuit 64-2 shown in FIG. 6 smaller, the NMOS 64a, 64b and 64e and the PMOS 64c, 64d and 64f are formed in a vertical direction.

(3) Operation

In the memory cell shown in FIG. 2, the operations of writing data in and reading out data from, for example, the memory cell 50-21 shown in FIG. 1 will be explained.

In writing data in the memory cell 50-21 shown in FIG. 1, the data for writing is transmitted to the bit lines BL1 and BL1/ by the input/output circuit 22 shown in FIG. 10. The word line WL2 turns "H" level by the row address decoder 21 shown in FIG. 10, and the NMOS 53 and 54 inside the memory cell 50-21 turn on. When the NMOS 53 and 54 turn on, the data on the bit lines BL1 and BL1/ are written in the nodes N11 and N12. At this time, the read enable signal RE is "H" level, and the output signal from the NOR circuit 62-1 turns "L" level while the NMOS 61-1 turns off and the "H" level of the read enable signal RE is inverted into "L" level by the inverter 63, and further, the output level of the AND circuit 64-2 turns "L".

Since the output level of the AND circuit 64-2 is "L", the NMOS 55a and 55b turn off. Consequently, the NMOS 55c or 55d does not drive the bit lines BL1 and BL1 even when writing the inversion data. As a result, the problem that the operation speed becomes lowered can be solved.

In reading out, since either the node N11 or N12 is "H" level with the data held in the nodes N11 and N12, either NMOS 55c or 55d turns on. For example, when the node N11 is "H" level and the node N12 is "L" level, the NMOS 55d turns on and the NMOS 55c turns off. In this state, the read enable signal RE is "L" level, the column select signal Y1 turns "L" level by the input/output circuit 22 shown in FIG. 10, and the word line WL2 turns "H" level by the row address decoder 21.

The output level of the NOR circuit 62-1 turns "H" and the NMOS 61-1 turns on, with the read enable signal RE "L" level and the column select signal Y1 "L" level, and the virtual ground line VGND1 becomes connected to the node of ground potential GND. Further, the NMOS 53 and 54 turn on by the "H" level of the word line WL2 while the "L" level of the read enable signal RE is inverted into "H" level by the inverter 63, and the NMOS 55a and 55b turn on by the "H" level of the output line L64-2 of the AND circuit 64-2. Then the NMOS 55a~55d with high capability of current-driving and with low threshold voltage drive the bit lines BL1 or BL1/, in addition to the bit line-driving by the inverter 51 or 52. And then the data in the nodes N11 and N12 are output to the bit lines BL1 and BL1/.

For example, in reading the "H" level of the node N11 and the "L" level of the node N12, the "L" level of the node N12 is read out to the bit line BL1/ through the NMOS 54 and pulled down to ground potential GND through the NMOS 55b, 55d and 61-1 with the bit line BL1/ turned on. Consequently, the readout speed of "H" level to the bit line BL1/, that is, the speed of readout operations of "H" level of the node N11 and "L" level of the node N12 becomes high.

(4) Effect

In this embodiment, the following effects (a) and (b) can be obtained.

(a) Since the NMOS 55a and 55b are driven by the word line WL2 and by the output line L64-2 of the AND circuit 64-2 for inputting the inversion signal of the read enable signal RE, the output line L64-2 of the AND circuit 64-2 turns "L" and the NMOS 55a and 55b turn off. Consequently, the NMOS 55c or 55d does not drive the bit lines BL1 and BL/ in writing. As a result, the NMOS 55c or 55d does not drive the bit line BL1 or BL/ as it did conventionally in writing the inversion data, and the operation speed is not lowered.

(b) Although the memory cell size becomes larger if the acceleration circuit 55 is provided inside the memory cells 50-11, . . . , the area scarcely increases even by providing the virtual ground lines VGND1, . . . and the output lines L64-1, . . . of the AND circuits 64-1, . . . . Moreover, since the memory cells 50-11, . . . share the AND circuits 64-1 . . . , the area increases slightly by providing the AND circuits 64-1 . . . . Consequently, the power supply voltage and the power consumption can be saved without enlarging the memory cell array size including the memory cell size. Further consequently, if the SRAM presented in this embodiment is utilized for a battery-operated (for example, 1.2 V) portable terminal and the like the storage capacity of which is relatively small (for example, 128 Kbit), a remarkable effect can be obtained.

(Second Embodiment)

(1) Configuration

Figure 7:
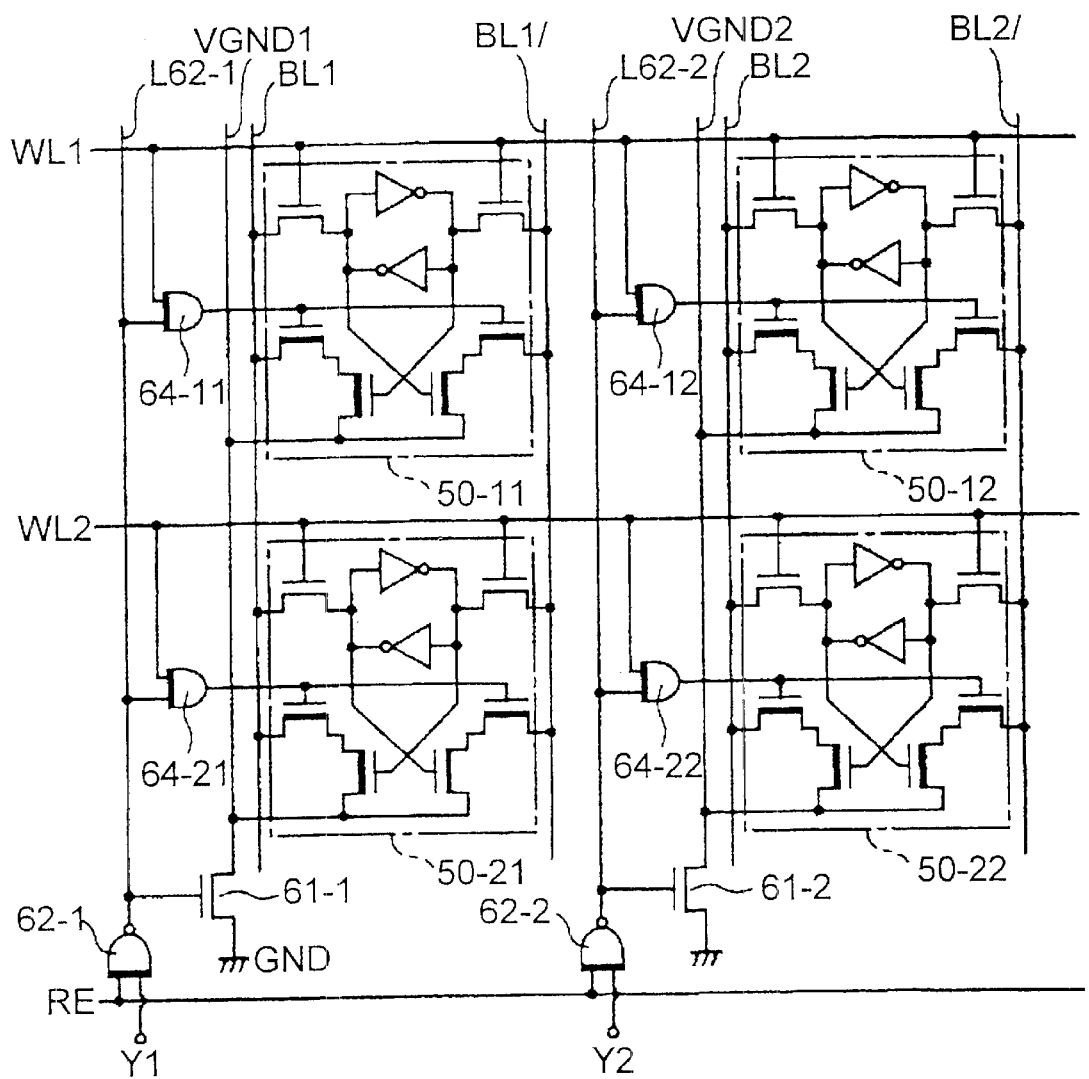
FIG. 7 is a partial circuit diagram illustrating purview of a memory cell array in the second embodiment of the present invention.
Figure 8:
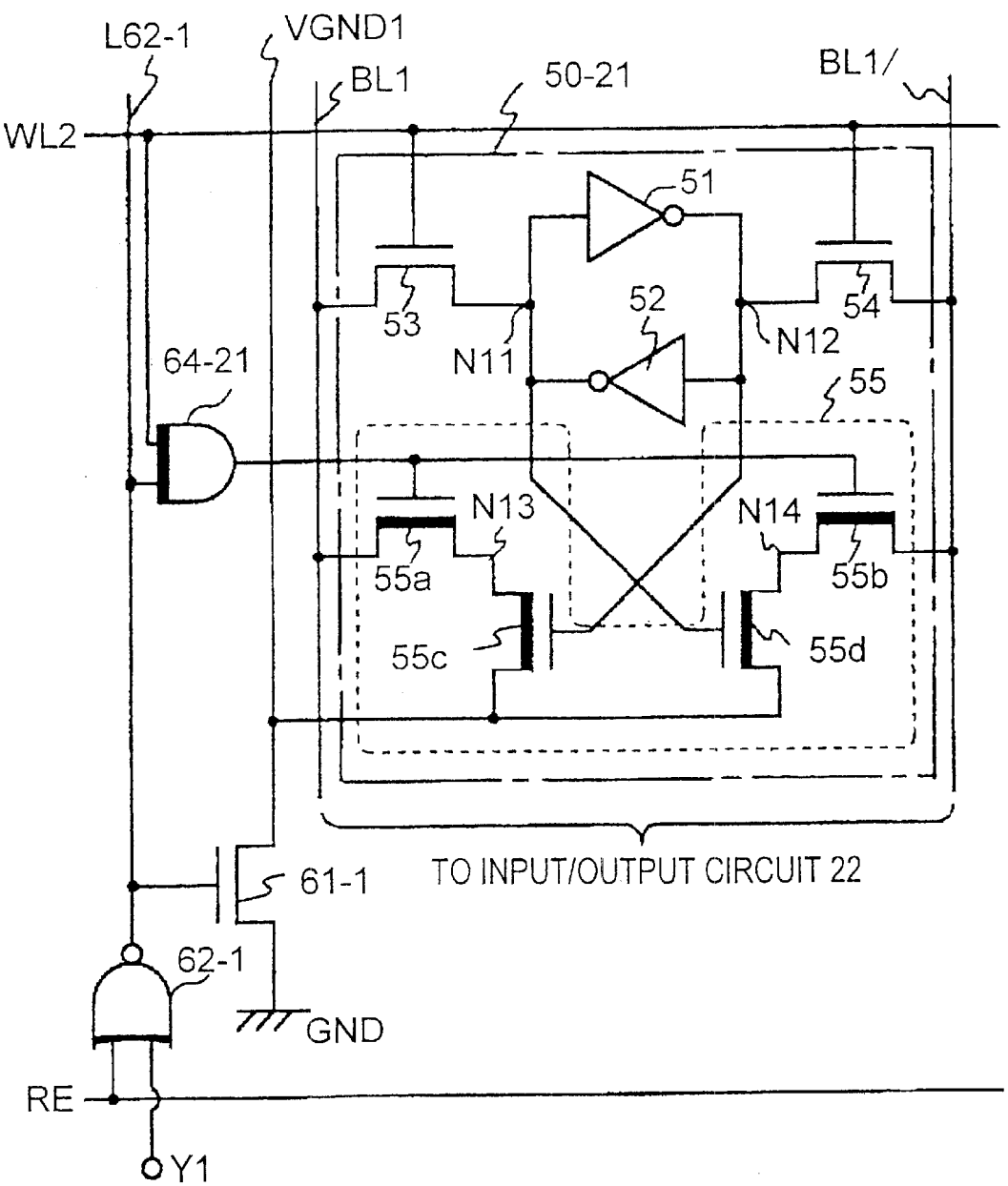
FIG. 8 is a circuit diagram illustrating near a memory cell 50-21 in FIG. 7.

FIG. 7 is a partial circuit diagram illustrating purview of a memory cell array in SRAM in the second embodiment of the present invention. FIG. 8 is a circuit diagram illustrating near a memory cell 50-21 in FIG. 7. Same reference numerals are attached to the same components in FIGS. 1 and 2 showing the first embodiment.

In the memory cell array shown in FIG. 7 in the second embodiment, the inverter 63 shown in FIG. 2 is omitted, and output lines L62-1, L62-2, . . . of two-input NOR circuits 62-1, 62-2, . . . , that is, the first logical circuit provided on each column are provided extending outward almost in parallel to each virtual ground line VGND1, VGND2, . . . . The input terminals of two-input AND circuits 64-11, 64-12, 64-21, 64-22, . . . , that is, the second logical circuit (or the third logical circuit), are connected to the cross points of the output lines L62-1, L62-2, . . . and the word lines WL1, WL2 . . . . The gates of NMOS 55a and 55b inside the memory cells 50-11, 50-12, 50-21, 50-22, . . . are connected to the output terminals of the AND circuits 64-11, 64-12, 64-21, 64-22, . . . . Other configurations of the memory cells 50-11, 50-12, 50-21, 50-22, . . . are the same as shown in FIGS. 1 and 2.

(2) Operation

The operations of writing data in and reading out data from, for example, the memory cell 50-21 shown in FIG. 8 will be explained.

In writing data in the memory cell 50-21 shown in FIG. 8, a column select signal Y1 is selected by a column address decoder inside the input/output circuit 22 shown in FIG. 10, and turned "L" level. And the data for writing is transmitted to the bit lines BL1 and BL1/. The word line WL2 turns "H" level selected by the row address decoder 21 shown in FIG. 10, and the NMOS 53 and 54 inside the memory cell 50-21 turn on. When the NMOS 53 and 54 turn on, the data on the bit lines BL1 and BL1/ are written in the nodes N11 and N12.

At this time, since the read enable signal RE is "H" level, and the column select signal Y1 is "L" level, the output line L62-1 of the NOR circuit 62-1 is "L" level. If the output line L62-1 is "L" level, the NMOS 61-1 turns off and the virtual ground line VGND1 turns into floating state. And further, the output level of the AND circuit 64-21 turns "L". If the output level of the AND circuit 64-21 is "L", the NMOS 55a and 55b of the acceleration circuit 55 inside the memory cell 50-21 turn off. Consequently, the NMOS 55c or 55d does not drive the bit lines BL1 and BL/.

In reading out data from the memory cell 50-21, a column select signal Y1 is selected by a column address decoder inside the input/output circuit shown in FIG. 10, and turned "L" level. And the read enable signal RE turns "L" level. Further, the word line WL2 turns "H" level selected by the row address decoder 21. Since either the node N11 or N12 is "H" level with the data held in the nodes N11 and N12, either NMOS 55c or 55d turns on.

In this state, since the column select signal Y1 is also "L" level if the read enable signal RE turns "L" level, the output line L62-1 of the NOR circuit 62-1 turns "H" level. Further, the NMOS 53 and 54 turn on by the "H" level of the word line WL2 while the NMOS 55a and 55b turn on by the "H" level of the output from the AND circuit 64-21. Hereby the NMOS 55a~55d with high capability of current-driving and with low threshold voltage drive the bit lines BL1 or BL1/, in addition to the bit line-driving by the inverter 51 or 52.

For example, when the data of "H" level is stored in the node N11 and "L" level in the node N12, the NMOS 55d turns on by the "H" level of the node N11 and the NMOS 55c turns off by the "L" level of the node N12, and the levels are pulled down to ground potential GND through the NMOS 55b, 55d and 61-1 with the bit line BL1/ turned on. For this reason, the readout speed of "L" level to the bit line BL1/ becomes high. At this time, since the input of the AND circuit 64-21 corresponds to the output of the NOR circuit 62-1 synchronizing the column select signal Y1, the AND circuit 64-21 driven in reading is only the selected memory cell 50-21.

(3) Effect

In this embodiment, the following effects (i)~(iii) can be obtained.

(i) Almost the same effect as the effect (a) in the first embodiment can be obtained.

(ii) Since the inputs of the AND circuits 64-11, 64-21, . . . correspond to the output of the NOR circuits 62-1, 62-2, . . . synchronizing the column select signals Y1, Y2, . . . , only the AND circuit 64-21 inside the memory cell 50-21 and the acceleration circuit 55, that are selected in reading drive. Hereby the power consumption in reading can be saved more than in the first embodiment.

Figure 9:
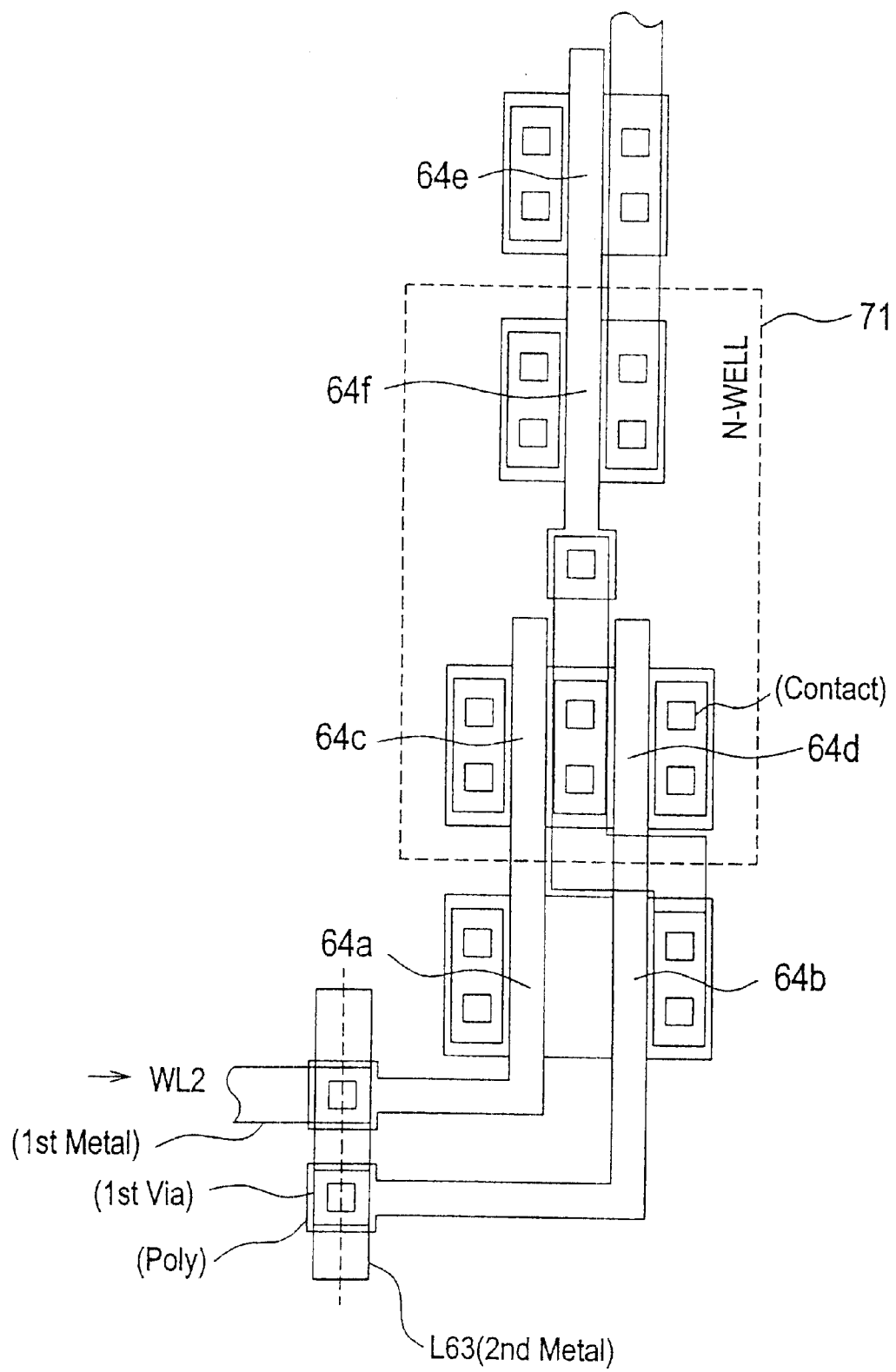
FIG. 9 is a schematic plan view illustrating a layout example of AND circuit 64-2 showing a modification example of FIG. 6(*a*).

(iii) Since the AND circuits 64-11, 64-12, 64-21, 64-22, . . . for driving the acceleration circuit are provided in each memory cell 50-11, 50-12, 50-21, 50-22, . . . , the number of element increases compared to that of the first embodiment and the memory cell array size becomes a little large. As shown in FIG. 9 illustrating the modification of FIG. 6(a), however, changing the layout of each AND circuit 64-11, . . . from the one as shown in FIG. 6 to the one as shown in FIG. 9 in which these AND circuits extend in a column direction can prevent the size of the memory cell array from becoming large very much. Especially in the second embodiment, the effect of saving power consumption including saving power supply voltage is greater than that obtained by prevention of memory size increase.

(Modification)

The present invention is not restricted to the examples as described in these embodiments and various kinds of modification can be adopted. The modifications are as the following examples (1)~(3).

(1) FIG. 10 is a circuit diagram illustrating another configuration example of purview of a memory cell 50-21 in FIGS. 1 and 8. Same reference numerals are attached to the same components in FIG. 3.

In the memory cell 50-21 shown in FIG. 10, a flip-flop 80 with another configuration is provided instead of the flip-flop configured by the CMOS inverters 51 and 52 shown in FIG. 3. The flip-flop 80 is a high-resistance load type circuit and has resistances 51a-1 and 52a-2 and NMOS 51b and 52b. The resistance 51a-1 and the NMOS 51b are connected between the nodes of power supply voltage VDD and ground potential GND in series while the resistance 52a-2 and the NMOS 52b are connected between the nodes of power supply voltage VDD and ground potential GND in series. The node N11 of the connection point of resistance 51a-1 and the NMOS 51b is connected to the gate of the NMOS 52b. The node N12 of the connection point of resistance 52a-2 and the NMOS 52b is connected to the gate of the NMOS 51b.

Even in this configuration, the data is held as in FIG. 3. However, the amount of power consumption increases a little compared to the CMOS flip-flop shown in FIG. 3. The flip-flop in FIG. 3 and the flip-flop 80 in FIG. 9 can be changed to a data holding part or a data holding circuit each with other configurations.

(2) In FIGS. 1 and 8, and the like, the acceleration circuit 55 can be configured by PMOS instead of NMOS 55a~55d. In this configuration, the AND circuits 64-2, 64-21, . . . , can be replaced by an NAND circuit. Similarly, the NOR circuits 62-1, . . . , can be replaced by other logical circuits by changing the polarities of the input/output signals thereof.

(3) As each layout as shown in FIGS. 5, 6 and 9 merely shows one example, various kinds of layouts can be adopted in order to reduce the memory cell array size.

(4) Although, in these embodiments, the transistor is configured by an NMOS or a PMOS, the transistor can be configured by another kind of transistor such as FET. Also, the present invention can be adopted to the semiconductor memory devices other than SRAM.

What is claimed is:

1. A semiconductor memory device comprising:

a word line;

a bit line pair having first and second bit lines and selected by a bit line selection signal;

a power supply line;

a data holding circuit holding data in first and second nodes;

a first transistor with high threshold voltage connected between the first bit line and the first node and driven by a potential on the word line;

a second transistor with high threshold voltage connected between the second bit line and the second node and driven by a potential on the word line;

a third transistor with low threshold voltage connected between the first bit line and a third node;

a fourth transistor with low threshold voltage connected between the second bit line and a fourth node;

a fifth transistor with low threshold voltage connected between the third node and the power supply line and driven by data in the second node;

a sixth transistor with low threshold voltage connected between the fourth node and the power supply line and driven by data in the first node;

a seventh transistor with high threshold voltage connected between the power supply line and a fifth node with a specific potential and becoming turned-on in writing and turned-off in reading out; and a logical circuit making the third and fourth transistors turned-off in writing and the third and fourth transistors turned-on in reading out, based on the potential on the word line and a readout control signal or based on the potential on the word line, the readout control signal and the bit line selection signal.

2. A semiconductor memory device according to claim 1 wherein the first-seventh transistors are configured by a field-effect transistor.

3. A semiconductor memory device comprising:

a word line;

a bit line pair having first and second bit lines and selected by a bit line selection signal;

a virtual ground line;

a flip-flop holding data in first and second nodes;

a first transistor with high threshold voltage connected between the first bit line and the first node and driven by a potential on the word line;

a second transistor with high threshold voltage connected between the second bit line and the second node and driven by a potential on the word line;

a third transistor with low threshold voltage connected between the first bit line and a third node;

a fourth transistor with low threshold voltage connected between the second bit line and a fourth node;

a fifth transistor with low threshold voltage connected between the third node and the virtual ground line and driven by data in the second node;

a sixth transistor with low threshold voltage connected between the fourth node and the virtual ground line and driven by data in the first node;

a seventh transistor with high threshold voltage connected between the virtual ground line and a ground potential node;

a first logical circuit making the seventh transistor turned-off in writing and the seventh transistor turned-on in reading out, based on a readout control signal and the bit line selection signal; and a second logical circuit making the third and fourth transistors turned-off in writing and the third and fourth transistors turned-on in reading out, based on the potential on the word line and the readout control signal.

4. A semiconductor memory device according to claim 3 wherein a plurality of memory cells having the flip-flop and the first-sixth transistors and a plurality of the first logical circuits are connected in the direction of the word line and an output line of the second logical circuit that are connected almost in parallel while a plurality of memory cells and a plurality of the second logical circuits are connected in the directions of the bit line pair and the virtual ground line that are connected almost in an orthogonal direction to the word line and the output line of the second logical circuit.

5. A semiconductor memory device according to claim 3 wherein the first-seventh transistors are configured by a field-effect transistor.

6. A semiconductor memory device comprising:

a word line;

a bit line pair having first and second bit lines and selected by a bit line selection signal;

a virtual ground line;

a flip-flop holding data in first and second nodes;

a first transistor with high threshold voltage connected between the first bit line and the first node and driven by a potential on the word line;

a second transistor with high threshold voltage connected between the second bit line and the second node and driven by a potential on the word line;

a third transistor with low threshold voltage connected between the first bit line and a third node;

a fourth transistor with low threshold voltage connected between the second bit line and a fourth node;

a fifth transistor with low threshold voltage connected between the third node and the virtual ground line and driven by data in the second node;

a sixth transistor with low threshold voltage connected between the fourth node and the virtual ground line and driven by data in the first node;

a seventh transistor with high threshold voltage connected between the virtual ground line and a ground potential node;

a first logical circuit making the seventh transistor turned-off in writing and the seventh transistor turned-on in reading out, based on a readout control signal and the bit line selection signal; and a second logical circuit making the third and fourth transistors turned-off in writing and the third and fourth transistors turned-on in reading out, based on the potential on the word line and an output signal from the first logical circuit.

7. A semiconductor memory device according to claim 6 wherein a plurality of memory cells having the flip-flop and the first-sixth transistors and a plurality of the first and second logical circuits are connected in the direction of the word line while a plurality of memory cells and a plurality of the second logical circuits are connected in the directions of the bit line pair, the virtual ground line and the output line of the first logical circuit that are connected almost in an orthogonal direction to the word line.

8. A semiconductor memory device according to claim 6 wherein the first-seventh transistors are configured by a field-effect transistor.

9. A semiconductor memory device comprising: a memory cell reading out and writing data to be transmitted to first and second nodes, based on a control signal;

a word line selecting a specific memory cell;

a bit line pair selected by a bit line selection signal and having a first bit line transmitting the data to the first node and a second bit line transmitting the data to the second node; and a switch transistor the one end of which is connected to a node with a specific potential, the other end of which is corrected to a power supply line, and which turns on in writing;

the semiconductor memory device wherein the memory cell comprises: a data holding part holding data transmitted to the first and the second nodes;

a first transistor connected between the first bit line and the first node and controlled by the word line;

a second transistor connected between the second bit line and the second node and controlled by the word line;

a third transistor connected between the first bit line and a third node and operating at a threshold voltage lower than those of the first and the second transistors;

a fourth transistor connected between the second bit line and a fourth node and operating at a threshold voltage lower than those of the first and the second transistors;

a fifth transistor connected between the third node and the power supply line, operating at a threshold voltage lower than those of the first and the second transistors and controlled by the data transmitted to the second node; and a sixth transistor connected between the fourth node and the power supply line, operating at a threshold voltage lower than those of the first and the second transistors and controlled by the data transmitted to the first node;

and the semiconductor memory device wherein the third and the fourth transistors turn on in reading out, based on the word line and the control signal or based on the word line and an output signal from a logical circuit to which the control signal and the bit line selection signal are input.

10. A semiconductor memory device according to claim 9 wherein the transistor is configured by a field-effect transistor.

11. A semiconductor memory device comprising: a memory cell reading out and writing data to be transmitted to first and second nodes, based on a control signal;

a word line selecting a specific memory cell;

a bit line pair selected by a bit line selection signal and having a first bit line transmitting the data to the first node and a second bit line transmitting the data to the second node; and a switch transistor the one end of which is connected to a node of a ground potential, the other end of which is connected to a power supply line, and which turns off based on an output signal from a first logical circuit to which the control signal and the bit line selection signal are input in writing and making the power supply line function as a virtual ground line in an electrically-floating condition;

the semiconductor memory device wherein the memory cell comprises: a flip-flop holding data transmitted to the first and the second nodes;

a first transistor connected between the first bit line and the first node and controlled by the word line;

a second transistor connected between the second bit line and the second node and controlled by the word line;

a third transistor connected between the first bit line and a third node and operating at a threshold voltage lower than those of the first and the second transistors;

a fourth transistor connected between the second bit line and a fourth node and operating at a threshold voltage lower than those of the first and the second transistors;

a fifth transistor connected between the third node and the power supply line, operating at a threshold voltage lower than those of the first and the second transistors and controlled by the data transmitted to the second node; and a sixth transistor connected between the fourth node and the power supply line, operating at a threshold voltage lower than those of the first and the second transistors and controlled by the data transmitted to the first node;

and the semiconductor memory device wherein the third and the fourth transistors turn on in reading out, based on the word line and an output signal from a second logical circuit to which the control signal is input.

12. A semiconductor memory device according to claim 11 wherein adjacent memory cells share one virtual ground line.

13. A semiconductor memory device according to claim 12 wherein adjacent memory cells further share one bit line pair.

14. A semiconductor memory device according to claim 11 wherein the transistor is configured by a field-effect transistor.

15. A semiconductor memory device comprising: a memory cell reading out and writing data to be transmitted to first and second nodes, based on a control signal;

a word line selecting a specific memory cell;

a bit line pair selected by a bit line selection signal and having a first bit line transmitting the data to the first node and a second bit line transmitting the data to the second node; and a switch transistor the one end of which is connected to a node of a ground potential, the other end of which is connected to a power supply line, and which turns off based on an output signal from a first logical circuit to which the control signal and the bit line selection signal are input in writing and controls the power supply line as a virtual ground line in an electrically-floating condition;

the semiconductor memory device wherein the memory cell comprises: a flip-flop holding data transmitted to the first and the second nodes;

a first transistor connected between the first bit line and the first node and controlled by the word line;

a second transistor connected between the second bit line and the second node and controlled by the word line;

a third transistor connected between the first bit line and a third node and operating at a threshold voltage lower than those of the first and the second transistors;

a fourth transistor connected between the second bit line and a fourth node and operating at a threshold voltage lower than those of the first and the second transistors;

a fifth transistor connected between the third node and the power supply line, operating at a threshold voltage lower than those of the first and the second transistors and controlled by the data transmitted to the second node; and a sixth transistor connected between the fourth node and the power supply line, operating at a threshold voltage lower than those of the first and the second transistors and controlled by the data transmitted to the first node;

and the semiconductor memory device wherein the third and the fourth transistors turn on in reading out, based on the word line and an output signal from a third logical circuit to which the output signal from the first logical circuit is input.

16. A semiconductor memory device according to claim 15 wherein adjacent memory cells share one virtual ground line.

17. A semiconductor memory device according to claim 16 wherein adjacent memory cells further share one bit line pair.

18. A semiconductor memory device according to claim 15 wherein the transistor is configured by a field-effect transistor.

* * * * *